United States Patent
An

(10) Patent No.: US 7,920,437 B2
(45) Date of Patent: Apr. 5, 2011

(54) ADDRESS CONTROL CIRCUIT OF SEMICONDUCTOR MEMORY APPARATUS

(75) Inventor: Sun Mo An, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 85 days.

(21) Appl. No.: 12/494,474

(22) Filed: Jun. 30, 2009

(65) Prior Publication Data
US 2010/0265784 A1 Oct. 21, 2010

(30) Foreign Application Priority Data
Apr. 20, 2009 (KR) .................. 10-2009-0034181

(51) Int. Cl.
*G11C 8/00* (2006.01)
(52) U.S. Cl. ............ 365/222; 365/201; 365/230.08
(58) Field of Classification Search .............. None
See application file for complete search history.

(56) References Cited

U.S. PATENT DOCUMENTS

| | | | | |
|---|---|---|---|---|
| 5,680,362 A | * | 10/1997 | Parris et al. | 365/230.01 |
| 6,034,904 A | * | 3/2000 | Kuromiya et al. | 365/201 |
| 7,038,967 B2 | | 5/2006 | Uchikoba et al. | |
| 7,292,490 B1 | | 11/2007 | Shu et al. | |
| 7,313,035 B2 | | 12/2007 | Lynch et al. | |
| 7,453,753 B2 | | 11/2008 | Chun | |
| 7,477,562 B2 | | 1/2009 | Seo | |
| 2008/0031069 A1 | | 2/2008 | Shu et al. | |

FOREIGN PATENT DOCUMENTS

| | | |
|---|---|---|
| JP | 11-345486 A | 12/1999 |
| JP | 2005-166149 A | 6/2005 |
| KR | 100474421 B1 | 2/2005 |

* cited by examiner

*Primary Examiner* — Tan T. Nguyen
(74) *Attorney, Agent, or Firm* — Ladas & Parry LLP

(57) ABSTRACT

An address control circuit for a semiconductor memory apparatus so as to make a refresh operation test possible by designating a refresh address is presented. The circuit includes a buffer block, a decoder, and a latch block. The buffer block receives coding information coded testing address information in accordance to a test signal. The decoder generates a test refresh address by decoding the coding information. The latch block latches the test refresh address depending on the test signal.

25 Claims, 4 Drawing Sheets

ADDRESS CONTROL CIRCUIT OF SEMICONDUCTOR MEMORY APPARATUS

CROSS-REFERENCES TO RELATED PATENT APPLICATION

The present application claims priority under 35 U.S.C 119(a) to Korean Application No. 10-2009-0034181, filed on Apr. 20, 2009, in the Korean Intellectual Property Office, which is incorporated herein by reference in its entirety as set forth in full.

BACKGROUND

1. Technical Field

The present invention described herein relates to a semiconductor memory apparatus and, more particularly, to an address control circuit of a semiconductor memory apparatus.

2. Related Art

Semiconductor memory apparatuses, particularly, volatile semiconductor memory apparatuses have been known to vary an original data level as data recorded in a memory cell elapses. That is, data can be compromised and subsequently lost.

Therefore, in the semiconductor memory apparatuses, it is essential that a refresh operation for maintaining a data level recorded in a memory cell must be performed.

The refresh operation of the semiconductor memory apparatus can be divided into an auto refresh operation that is performed depending on an external command and into a self refresh operation that is internally performed at a predetermined cycle.

Since the self refresh operation is internally performed in the semiconductor memory apparatus not by the external command, a circuit component for designating a refresh address for a cyclic refresh operation is required.

Therefore, the semiconductor memory apparatus is provided with an address control circuit as a circuit for generating the refresh address and selectively providing a normal address inputted from the outside for an active operation, i.e., a read or write operation, and that the refresh address to a memory area is referred to as a bank.

As shown in FIG. 1, the address control circuit 10 can include a counter block 11 and a latch block 12.

The counter block 11 can generate refresh addresses 'RRA<0:12>' by counting a refresh signal 'REF'.

The latch block 12 can generate bank addresses 'BX<0:12>' for latching and providing normal addresses 'AT<0:12>' or the refresh addresses 'RRA<0:12>' to the bank depending on an active pulse signal 'ATCP' and the refresh signal 'REF'.

Further, although not shown in FIG. 1, an address buffer for receiving an external address and a decoder for generating the normal addresses 'AT<0:12>' by decoding the output of the address buffer are provided. The address buffer, particularly, an address buffer that receives a row address related to the refresh operation stops to operate to reduce current during the refresh operation.

Since the refresh addresses 'RRA<0:12>' are sequentially increased by the counter block 11, values of the refresh addresses 'RRA<0:12>' cannot be known during the refresh operation and the refresh addresses cannot be changed outside of the semiconductor memory apparatus.

As such, in the semiconductor memory apparatus, the values of the refresh addresses 'RRA<0:12>' cannot be known during the refresh operation and the refresh addresses cannot be changed. Therefore, when a failure occurs during the refresh operation, the relevant failure details cannot be grasped.

SUMMARY

An address control circuit of a semiconductor memory apparatus so as to make a refresh operation test possible by designating a refresh address is disclosed herein.

In a first embodiment, an address control circuit of a semiconductor memory apparatus includes a buffer block configured to receive coding information coded testing address information depending on a test signal; a decoder configured to generate a test refresh address by decoding the coding information; and a latch block configured to latch the test refresh address depending on the test signal.

In a second embodiment, an address control circuit of a semiconductor memory apparatus includes a data mask buffer configured to receive data mask information in an active mode and receive a coded refresh address in a test mode; a decoder configured to generate a test refresh address by decoding the coded refresh address; and a latch configured to latch the test refresh address in the test mode and latch a normal refresh address or the normal address not in the test mode.

In a third embodiment, an address control circuit of a semiconductor memory apparatus includes a data mask buffer configured to receive data mask information or a test refresh address; a counter configured to generate a normal refresh address in response to a refresh signal; and a latch configured to selectively latch the test refresh address and the normal refresh address, wherein the data mask buffer is activated in response to a test signal during an interval when the semiconductor memory apparatus does not perform an active operation and the test refresh address inputted through the activated data mask buffer is latched through the latch.

In a fourth embodiment, an address control method of a semiconductor memory apparatus includes receiving a refresh address coded to a target value through the data mask buffer in response to a test signal; generating a test refresh address by decoding the refresh address coded to the target value; and latching the test refresh address in response to the test signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
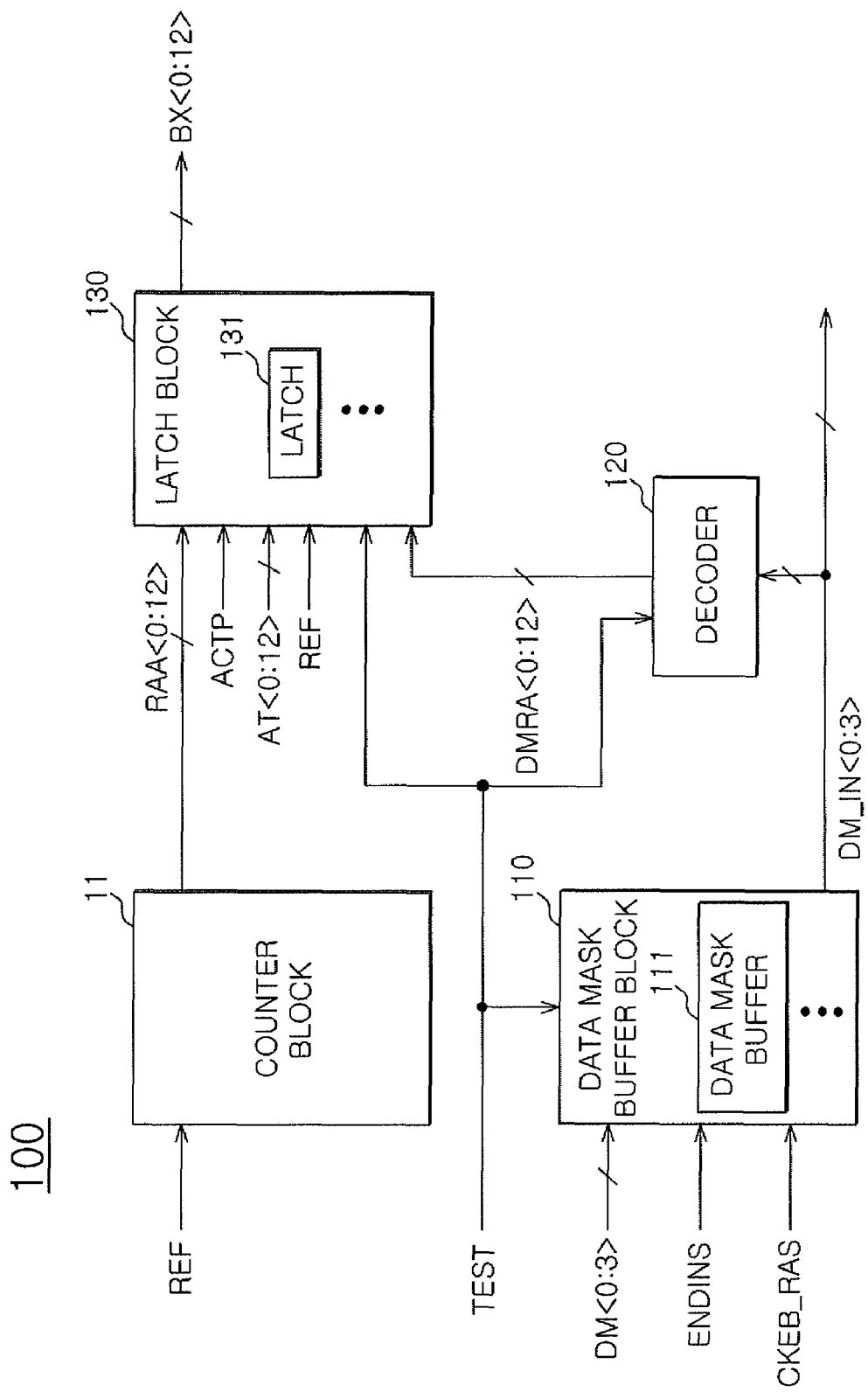
FIG. 2 is a block diagram of an exemplary address control circuit 100 of a semiconductor memory apparatus according to one embodiment.

FIG. 2 is a block diagram of an exemplary address control circuit 100 of a semiconductor memory apparatus according to one embodiment.

The address control circuit 100 shown in FIG. 2 is a component that is suitable to use 13-bit normal addresses 'AT<0:12>', 13-bit refresh addresses 'PRA<0:12>', test refresh addresses 'DMRA<0:12>', and 4-bit data mask information 'DM<0:3>', as an example.

The test refresh addresses 'DMRA<0:12>' for substituting for the refresh addresses 'RRA<0:12>' in a test mode are generated by decoding 4-bit data mask information 'DM<0:3>' provided from the outside and will be described in detail below.

As shown in FIG. 2, the address control circuit of the semiconductor memory apparatus can include a counter block 11, a data mask buffer block 110, a decoder 120, and a latch block 130.

Figure 1:
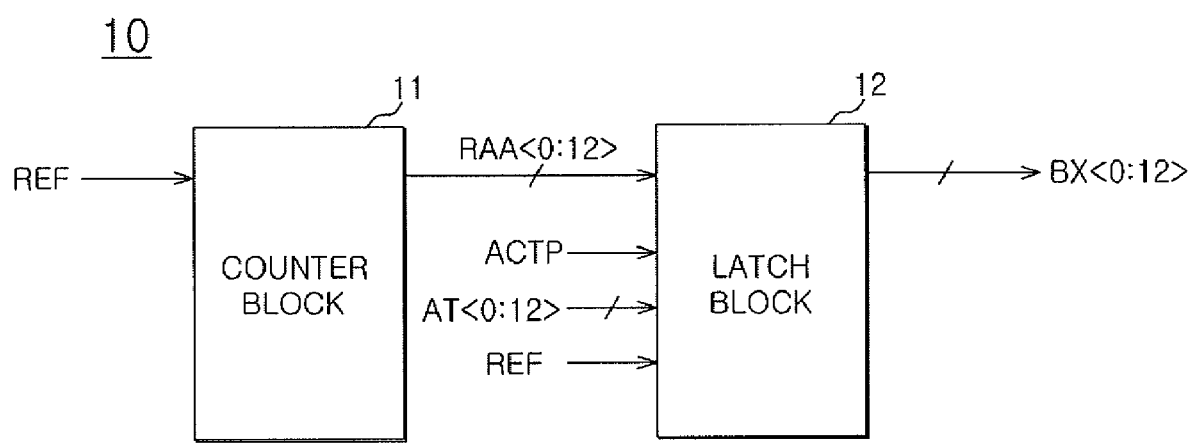
FIG. 1 is a block diagram of an address control circuit 10 of a semiconductor memory apparatus in the prior art.

The counter block 11 can generate refresh addresses 'RRA<0:12>' by counting a refresh signal 'REF' and can be implemented similarly as the prior art shown in FIG. 1.

The data mask buffer block 110 can include a plurality of data mask buffer 111, that is, as many as the bits of the data mask information 'DM<0:3>'. The data mask buffer block 110 is configured to output internal data mask information 'DM_IN<0:3>' by buffering the data mask information 'DM<0:3>' provided from the outside of the semiconductor memory apparatus in response to a test signal 'TEST'.

The data mask information 'DM<0:3>' is not inputted except for a read or write operation interval of the semiconductor memory apparatus. A read or write operation of the semiconductor memory apparatus can be found by a signal 'ENDINS' for defining termination of data input and a signal 'CKEB_RAS' for defining activation of a clock signal 'CLK' (not shown). That is, when the signal 'ENDINS' for defining the termination of the data input is activated or the signal 'CKEB_RAS' for defining the activation of the clock signal is deactivated, the semiconductor memory apparatus does not perform the read or write operation.

Accordingly, the data mask buffer block 110 stops to operate while the data mask information 'DM<0:3>' is not inputted, that is, the semiconductor memory apparatus does not perform the read or write operation and thereby minimizes current consumption.

In addition, the data mask buffer block 110 is configured to generate the internal data mask information 'DM_IN<0:3>' by receiving coding information, that is, a refresh address to be tested through a pad for receiving the data mask information 'DM_IN<0:3>' during a refresh test.

The data mask buffer block 110 stops to operate when the signal 'ENDINS' for defining the termination of the data input is activated or the signal 'CKEB_RAS' for defining the activation of the clock signal is deactivated. But the data mask buffer clock 110 is configured to receive the coding information regardless of the signal 'ENDINS' for defining the termination of the data input and the signal 'CKEB_RAS' for defining the activation of the clock signal when the test signal 'TEST' is activated.

The decoder 120 is configured to generate the test refresh addresses 'DMRA<0:12>' by decoding the internal data mask information 'DM_IN<0:3>' in response to the test signal 'TEST'. At this time, circuit design of the decoder 120 depends on coding/decoding tables of predetermined data mask information 'DM<0:3>' and the test refresh addresses 'DMRA<0:12>'.

The latch block 130 can include a plurality of latches 131, that is, as many as the number of bits of the test refresh addresses 'DMRA<0:12>'.

The latch block 130 is configured to generate bank addresses 'BX<0:12>' for a general refresh operation or a refresh test operation by selecting the refresh addresses 'RRA<0:12>' or the test refresh addresses 'DMRA<0:12>' in response to the refresh signal 'REF' and the test signal 'TEST'. Further, the latch block 130 is configured to generate the bank addresses 'BX<0:12>' for an active operation, i.e., a read or write operation by latching normal addresses 'AT<0:12>' in response to the refresh signal 'REF' and an active pulse signal 'ATCP'. The bank addresses 'BX<0:12>' are valid addresses used in a bank at the time of inputting an active command or a refresh command.

Figure 3:
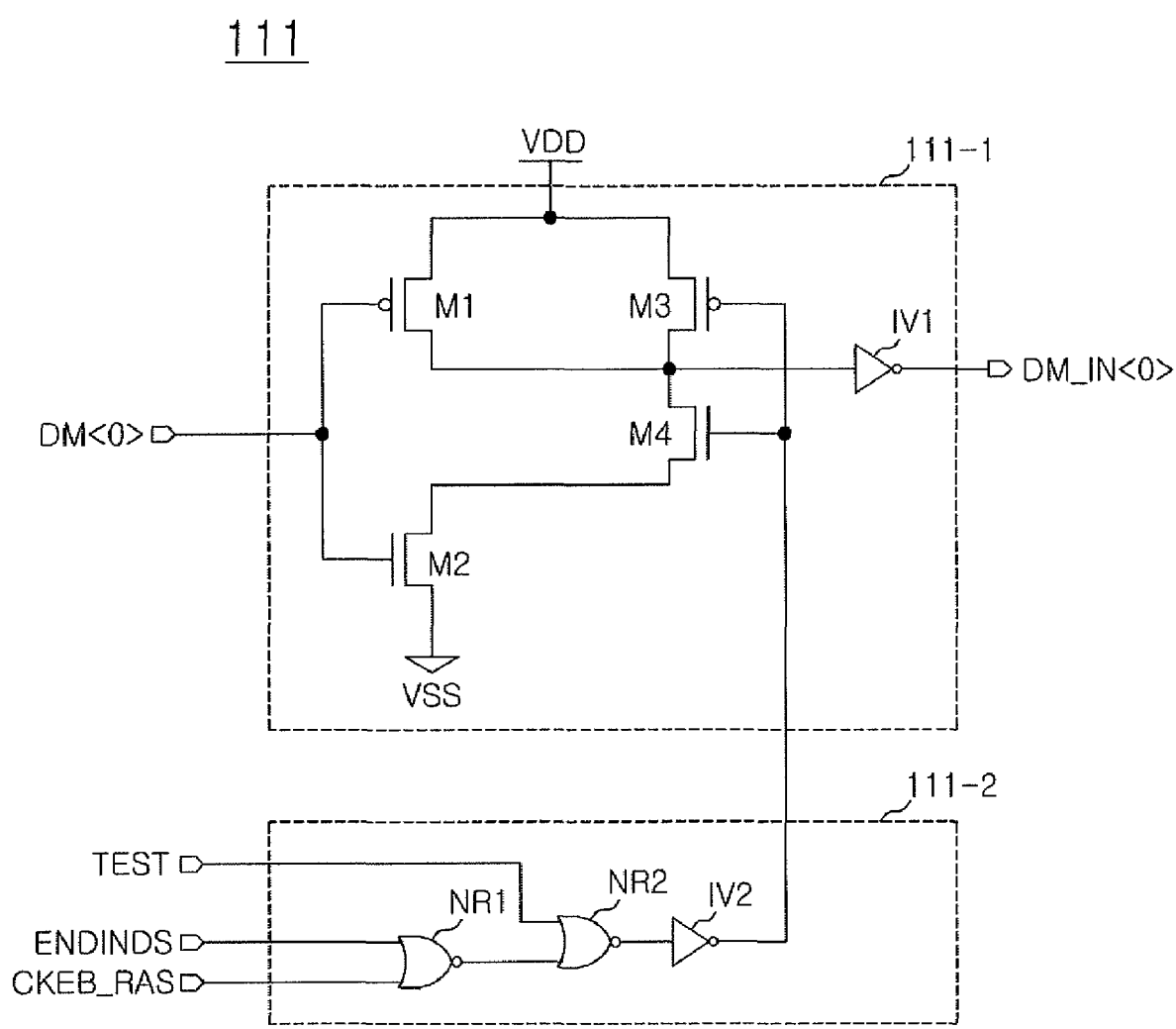
FIG. 3 is a circuit diagram of an exemplary data mask buffer 111 that can be included with the circuit of FIG. 2 according to one embodiment.

FIG. 3 is a circuit diagram of an exemplary data mask buffer 111 that can be included with the circuit of FIG. 2 according to one embodiment.

FIG. 3 illustrates the data mask buffer 111 that receives the data mask information 'DM<0>'. Data mask buffers that receive the rest data mask information 'DM<1:3>' can also be implemented in a similar manner as the data mask buffer 111. The signal 'ENDINS' for defining the termination of the data input, the signal 'CKEB_RAS' for defining the activation of the clock signal 'CLK', and the test signal 'TEST' are commonly inputted into the data mask buffer 111.

As shown in FIG. 3, the data mask buffer 111 can include a buffer circuit unit 111-1 and an operation control unit 111-2.

The buffer circuit unit 111-1 can include first to fourth transistors M1 to M4 and a first inverter IV1. The buffer circuit unit 111-1 can output the internal data mask information 'DM_IN<0>' by buffering the data mask information 'DM<0>' The buffer circuit unit 111-1 has been just described as one example and a general buffer circuit component can also be adopted.

The operation control unit 111-2 can include first and second NOR gates NR1 and NR2 and a second inverter IV2. The operation control unit 111-2 is configured to control activation (operable state) or deactivation (inoperable state) of the buffer circuit unit 111-1 depending on combination of the signal 'ENDINS' for defining the termination of the data input, the signal 'CKEB_RAS' for defining the activation of the clock signal 'CLK', and the test signal 'TEST'.

In a state in which the test signal 'TEST' is deactivated at a low level, the operation control unit 111-2 outputs a low-level signal to turn off a fourth transistor M4 when the signal 'ENDINS' for defining the termination of the data input is activated at a high level or the signal 'CKEB_RAS' for defining the activation of the clock signal is deactivated at a high level. Since the fourth transistor M4 is turned off, the buffer circuit unit 111-1 is deactivated, thereby maintaining the internal data mask information 'DM_IN<0>' at a low level regardless of the data mask information 'DM<0>' inputted from the outside. That is, the input of the data mask information 'DM<0>' is interrupted.

Meanwhile, the operation control unit 111-2 outputs a high-level signal to turn on the fourth transistor M4 regardless of the signal 'ENDINS' for defining the termination of the data input and the signal 'CKEB_RAS' for defining the activation of the clock signal when the test signal 'TEST' is activated at a high level. Since the fourth transistor M4 is turned on, the buffer circuit unit 111-1 is activated to buffer and output the data mask information 'DM<0>' inputted from the outside as the internal data mask information 'DM_IN<0>'.

Figure 4:
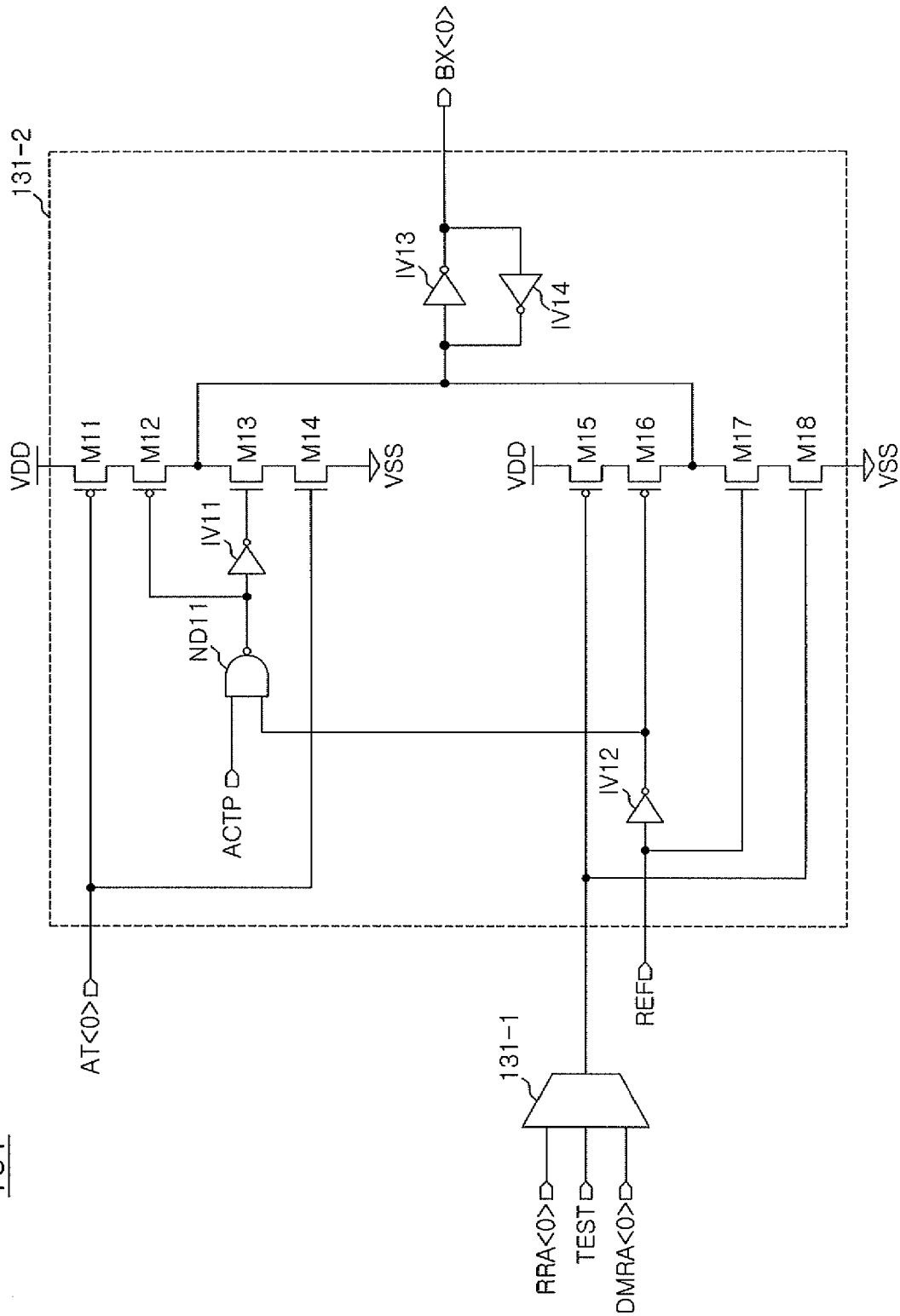
FIG. 4 is a circuit diagram of an exemplary latch 131 that can be included with the circuit of FIG. 2 according to one embodiment.

FIG. 4 is a circuit diagram of an exemplary latch 131 that can be included with the circuit of FIG. 2 according to one embodiment.

FIG. 4 illustrates the latch 131 that receives the normal address 'AT<0>', the refresh address 'RRA<0>', and the test refresh address 'DMRA<0>'. Latches that receive the rest normal addresses 'AT<1:12>', refresh addresses 'RRA<1:12>', and test refresh addresses 'DMRA<1:12>' can also be implemented similarly as the latch 131. The active pulse signal 'ATCP', the refresh signal 'REF', and the test signal 'TEST' are commonly inputted into the latch 131.

As shown in FIG. 4, the latch 131 can include a multiplexing unit 131-1 and a latch circuit unit 131-2.

The multiplexing unit 131-1 is configured to select and output the refresh address 'RRA<0>' or the test refresh address 'DMRA<0>' depending on the test signal 'TEST'.

The multiplexing unit 131-1 selects and outputs the test refresh address 'DMRA<0>' when the test signal 'TEST' is activated at a high level and selects and outputs the refresh address 'RRA<0>' when the test signal 'TEST' is deactivated at a low level.

The latch circuit unit 131-2 can include a first NAND gate ND11, third to sixth inverters IV11 to IV14, and fifth to twelfth transistors M11 to M18. The latch circuit unit 131-2 is configured to generate the bank address 'BX<0>' by latching an output signal of the multiplexing unit 131-2 depending on the refresh signal 'REF' or generate the bank address 'BX<0>' by latching the normal address 'AT<0>' depending on the refresh signal 'REF' and the active pulse signal 'ATCP'.

The latch circuit unit 131-2 can generate the bank address 'BX<0>' by latching the output signal of the multiplexing unit 131-1 when the refresh signal 'REF' is activated at a high level. At this time, the bank address 'BX<0>' is supplied to the bank and is used as a valid row address during the general refresh operation or refresh test operation.

When the refresh signal 'REF' is deactivated at a low level, the latch circuit unit 131-2 can generate the bank address 'BX<0>' by latching the normal address 'AT<0>' as the active pulse signal 'ATCP' is activated at a high level. At this time, the bank address 'BX<0>' is supplied to the bank and is used as a valid row address during the active operation.

As described in the prior art, the address buffer of the semiconductor memory apparatus, particularly, the address buffer that receives the row address maintains the deactivation (inoperable) state during the refresh operation. Since this is the same as the present invention, a desired refresh address cannot be inputted through the address buffer unless a circuit configuration is changed.

Therefore, it possible to appropriately code and use the data mask information 'DM<0:3>' as the test refresh addresses 'DMRA<0:12>'. A decoder 120 is provided, which is designed to decode coding values of the data mask information 'DM<0:3>' to desired test refresh addresses 'DMRA<0:12>'.

The data mask buffer block 110 that receives the data mask information 'DM<0:3>' operates in a refresh mode by using the test signal 'TEST' so as to minimize circuit addition and a design burden caused by operating the address buffer in the refresh mode.

Further, when the test signal 'TEST' is not activated, the decoder 120 does not operate so as to reduce current consumption.

A refresh test operation using the address control circuit of the semiconductor memory apparatus will be described below.

First, the test signal 'TEST' is activated for the refresh test operation and the data mask information 'DM<0:3>' is inputted into the semiconductor memory apparatus. That is, refresh address information that is coded with an address value to be tested is inputted into a pad allocated to input the data mask information 'DM<0:3>'.

Meanwhile, the counter block 11 can generate the refresh addresses 'RRA<0:12>' by counting the refresh signal 'REF'.

Since the test signal 'TEST' is activated, the data mask buffers 111 of the data mask buffer block 110 can generate the internal data mask information 'DM_IN<0:3>' by buffering the data mask information 'DM<0:3>'.

Since the test signal 'TEST' is activated, the internal data mask information 'DM_IN<0:3>' is decoded by the decoder 120 and inputted into the latch block 130 as the test refresh addresses 'DMRA<0:12>'.

Since the test signal 'TEST' is activated, all latches 131 of the latch block 130 latch and output the test refresh addresses 'DMRA<0:12>' as the bank addresses 'BX<0:12>'.

Word lines corresponding to the bank addresses 'BX<0: 12>', that is, the row addresses are activated and refreshed.

Consequently, the refresh operation test can be performed by designating a predetermined row address to be tested outside of the semiconductor memory apparatus and thereby detects failure details.

Meanwhile, when the test signal 'TEST' is deactivated, the decoder 120 stops to operate and the latch block 130 can generate the bank addresses 'BX<0:12>' by selecting the normal addresses 'AT<0:12>' or the refresh addresses 'RRA<0:12>' depending on the refresh signal 'REF'. In addition, the data mask buffer block 110 generates the internal data mask information 'DM_IN<0:3>' by receiving actual data mask information 'DM<0:3>' and transfers the internal data mask information 'DM_IN<0:3>' to a data mask related circuit component during the active operation. Further, the data mask buffer block 110 stops to operate by the signal 'ENDINS' for defining the termination of the input data or the signal 'CKEB_RAS' for defining the activation of the clock signal during the refresh operation as described above.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. An address control circuit of a semiconductor memory apparatus, comprising:
    a buffer block configured to receive coding information coding testing address information in response to a test signal;
    a decoder configured to generate a test refresh address by decoding the coding information; and
    a latch block configured to latch the test refresh address in accordance to the test signal.

2. The address control circuit of claim 1, wherein the buffer block further receives data mask information.

3. The address control circuit of claim 1, wherein the buffer block is set to an operable state only when the test signal is activated except when the semiconductor memory apparatus is in an active operation interval.

4. The address control circuit of claim 1, wherein the buffer block comprises a plurality of buffers, each buffers includes:
    a buffer circuit unit configured to buffer a bit signal of the coding information; and
    an operation control unit configured to activate the buffer circuit unit in accordance to the test signal.

5. The address control circuit of claim 4, wherein the operation control unit is configured to activate the buffer circuit unit in response to a signal defining that the semiconductor memory apparatus performs an active operation or an activation of the test signal.

6. The address control circuit of claim 1, wherein the decoder is configured to decode the coding information in response to the activation of the test signal.

7. The address control circuit of claim 1, wherein the latch block comprises a plurality of latches, each latch includes:
   a multiplexer configured to select and output a normal refresh address or a bit signal of the test refresh address in response to the test signal; and
   a latch circuit configured to latch an output signal of the multiplexer in response to a refresh signal.

8. The address control circuit of claim 7 wherein the latch circuit is configured to latch the output signal of the multiplexer when the refresh signal is activated and to latch a normal address when the refresh signal is deactivated.

9. An address control circuit of a semiconductor memory apparatus, comprising:
   a data mask buffer configured to receive data mask information in an active mode and receive a coded refresh address in a test mode;
   a decoder configured to generate a test refresh address by decoding the coded refresh address; and
   a latch configured to latch the test refresh address when in the test mode and latch a normal refresh address or to latch the normal address when not in the test mode.

10. The address control circuit of claim 9, wherein the semiconductor memory apparatus includes a data mask pad for receiving the data mask information, wherein the data mask buffer is configured to receive the data mask information through the data mask pad when in the active mode and to receive the coded refresh address through the data mask pad when in the test mode.

11. The address control circuit of claim 9, wherein the data mask buffer includes:
   a buffer circuit unit configured to buffer a bit signal of the coded refresh address; and
   an operation control unit configured to activate the buffer circuit unit in response to a test signal for defining the test mode.

12. The address control circuit of claim 11, wherein the operation control unit is configured to activate the buffer circuit unit in response to a signal defining that the semiconductor memory apparatus performs an active operation or defining that the semiconductor memory apparatus performs an activation of the test signal.

13. The address control circuit of claim of claim 9, wherein the decoder is configured to stop a decoding operation in response to a deactivation of the test signal.

14. The address control circuit of claim 9, wherein the latch includes:
   a multiplexer configured to select and output the test refresh address or to select and output the normal refresh address in accordance to a test signal for defining the test mode; and
   a latch circuit configured to latch an output signal of the multiplexer in response to a refresh signal.

15. The address control circuit of claim 14, wherein the latch circuit is configured to latch the output signal of the multiplexer when the refresh signal is activated and to latch the normal address when the refresh signal is deactivated.

16. An address control circuit of a semiconductor memory apparatus, comprising:
   a data mask buffer configured to receive data mask information or to receive a test refresh address;
   a counter configured to generate a normal refresh address in response to a refresh signal; and
   a latch configured to selectively latch the test refresh address and the normal refresh address,
   wherein when the semiconductor memory apparatus does not perform an active operation the data mask buffer is activated in response to a test signal and the test refresh address inputted through the activated data mask buffer is latched through the latch.

17. The address control circuit of claim 16, wherein the data mask buffer includes:
   a buffer circuit unit configured to buffer the data mask information or the test refresh address, and
   an operation control unit configured to activate the buffer circuit unit in accordance to a signal defining that the semiconductor memory apparatus performs the active operation or the test signal.

18. The address control circuit of claim 16, wherein the address control circuit further includes a decoder configured to decode the test refresh address inputted through the data mask buffer to transfer the decoded test refresh address to the latch, and
   wherein the decoder stops a decoding operation in response to a deactivation of the test signal.

19. The address control circuit of claim 16, wherein the latch includes:
   a multiplexer configured to select and output the test refresh address or the normal refresh address in accordance to the test signal; and
   a latch circuit configured to latch an output signal of the multiplexer in response to the refresh signal.

20. The address control circuit of claim 19, wherein when the refresh signal is activated the latch circuit is configured to latch the output signal of the multiplexer and when the refresh signal is deactivated the latch circuit is configured to latch a normal address.

21. An address control method of a semiconductor memory apparatus having a data mask buffer, comprising:
   receiving a refresh address coded to a target value through the data mask buffer in response to a test signal;
   generating a test refresh address by decoding the refresh address coded to the target value; and
   latching the test refresh address in response to the test signal.

22. The address control method of claim 21, wherein the receiving the refresh address further includes receiving data mask information in response to a deactivation of the test signal and an activation of a signal for defining an active operation mode of the semiconductor memory apparatus.

23. The address control method of claim 21, wherein the decoding the refresh address is stopped in response to the deactivation of the test signal.

24. The address control method of claim 21, wherein in the latching step, the test refresh address or a normal address is selected in response to an activation or a deactivation of the test signal, and the selected address is latched in response to an activation of a refresh signal and a normal address is latched in response to a deactivation of the refresh signal.

25. The address control method of claim 24, wherein the test refresh address is set to a desired value outside of the semiconductor memory apparatus and the normal refresh address cyclically increases in the semiconductor memory apparatus.

* * * * *